United States Patent
Schubert

(10) Patent No.: US 8,378,449 B2
(45) Date of Patent: Feb. 19, 2013

(54) CIRCUIT ARRANGEMENT FOR THE POWER SUPPLY OF AN INTEGRATED CIRCUIT

(75) Inventor: Goeran Schubert, Schwabach (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 565 days.

(21) Appl. No.: 12/312,058

(22) PCT Filed: Oct. 30, 2007

(86) PCT No.: PCT/DE2007/001944
§ 371 (c)(1),
(2), (4) Date: Apr. 22, 2009

(87) PCT Pub. No.: WO2008/064627
PCT Pub. Date: Jun. 5, 2008

(65) Prior Publication Data
US 2010/0052773 A1    Mar. 4, 2010

(30) Foreign Application Priority Data

Nov. 27, 2006 (DE) .......................... 10 2006 056 181
Jul. 9, 2007 (DE) .......................... 10 2007 032 092

(51) Int. Cl.
*H01L 21/02* (2006.01)

(52) U.S. Cl. ...................................... 257/532; 307/147

(58) Field of Classification Search .............. 307/43, 307/147; 361/748, 753, 780; 257/532, E23.01, 257/E23.011, E23.057
See application file for complete search history.

(56) References Cited

U.S. PATENT DOCUMENTS

| | | | |
|---|---|---|---|
| 5,912,581 A * | 6/1999 | Giebel et al. ................. | 327/530 |
| 6,359,237 B1 | 3/2002 | Tohya et al. | |
| 6,407,432 B1 | 6/2002 | Nemoto et al. | |
| 7,085,143 B1 | 8/2006 | Dyckman et al. | |

(Continued)

FOREIGN PATENT DOCUMENTS

| | | |
|---|---|---|
| DE | 100 39 392 | 3/2001 |
| JP | 2002-057418 | 2/2002 |

(Continued)

OTHER PUBLICATIONS

International Preliminary Report on Patentability for Application No. PCT/DE2007/001944, dated Jun. 3, 2009, 8 pages, International Bureau of WIPO, Geneva, Switzerland.

(Continued)

*Primary Examiner* — Daniel Cavallari
(74) *Attorney, Agent, or Firm* — W. F. Fasse

(57) ABSTRACT

In a circuit arrangement (1) it is provided for supplying an integrated circuit (4) with electrical energy in a reliable and low-emission manner that a first ground connection (14) of the integrated circuit (4) is connected to a circuit carrier ground (3) and that an external buffer capacitor (17) is connected to a supply connection (5) and a second ground connection (18) of the integrated circuit (4). The arrangement is further equipped with a supply unit (15), which has a current source behavior, at least at a clock frequency of the integrated circuit (4). The buffer capacitor (17) reduces load-related voltage fluctuations, the current source behavior of the supply unit (15) causing a decoupling of the frequency between the charging and discharging process of the buffer capacitor (17). The high-frequency discharging currents are tightly restricted in the circuit arrangement (1), thus preventing significant emission.

15 Claims, 5 Drawing Sheets

U.S. PATENT DOCUMENTS

| | | |
|---|---|---|
| 2002/0019155 A1 | 2/2002 | Unou et al. |
| 2004/0217442 A1* | 11/2004 | Miyagi .......................... 257/531 |
| 2005/0156277 A1* | 7/2005 | Nakano et al. ................. 257/532 |
| 2008/0197820 A1 | 8/2008 | Schubert |

FOREIGN PATENT DOCUMENTS

| | | |
|---|---|---|
| JP | 2005-294651 | 10/2005 |
| JP | 2006-120786 | 5/2006 |
| WO | WO 2006/094469 | 9/2006 |

OTHER PUBLICATIONS

Partial English translation of Japanese Office Action issued Jun. 5, 2012 in Japanese Patent Application 2009-538580, 1 page.

* cited by examiner

CIRCUIT ARRANGEMENT FOR THE POWER SUPPLY OF AN INTEGRATED CIRCUIT

FIELD OF THE INVENTION

The invention relates to a circuit arrangement for the power supply of an integrated circuit.

BACKGROUND INFORMATION

In automotive engineering more and more integrated circuits, for example in the form of microprocessors or microcontrollers, are used. For their power supply usually an external blocking capacitor connected in parallel manner between a supply input of the integrated circuit and a circuit carrier ground as well as a voltage source connected parallel thereto are provided. Both the blocking capacitor and the voltage source are directly connected with the circuit carrier ground. The voltage source charges the blocking capacitor, the energy supplied to the integrated circuit being extracted from the blocking capacitor by means of a discharging current. Hereby, a reproduction of an ideal voltage source which is as realistic as possible is to be achieved. For this purpose the blocking capacitor usually has a blocking capacity of approx. 100 nF. The described circuit arrangement is discussed in detail in WO 2006/094469 A1, to which reference is made. It is disadvantageous with the described circuit arrangement that it leads to an undesired high emission of electromagnetic energy, in particular if a clock frequency of the integrated circuit adopts higher values than 10 MHZ. The EMC-requirements of the automotive industry can then no longer be complied with.

From WO 2006/094469 A1 a circuit arrangement is known, with the aid of which an integrated circuit can be supplied with energy even with a high clock frequency, in particular in the MHz region, wherein simultaneously the emission of electromagnetic energy is significantly reduced compared with the above-described circuit arrangement and the EMC-requirements of the automotive industry can be complied with. The reduced emission is achieved by doing without the external wiring with the blocking capacitor and using instead an internal bus capacity which is anyway present within the integrated circuit. Furthermore, a supply unit with an internal resistance which is as high as possible is used in place of a low-impedance voltage source. By these measures a frequency decoupling of the charging and discharging of the internal bus capacity is achieved. Whereas the discharging of the bus capacity continues with the high clock frequency, the discharging in turn is effected with a significantly deeper frequency. Due to the fact that the high-frequency discharging process takes place in a spatially tight manner within the integrated circuit and that the charging process is low-frequent, both the charging and the discharging process do not effect a significant emission of electromagnetic energy. However, it is disadvantageous that the used internal bus capacity is only approx. 5 nF, so that voltage fluctuations arise with the supply of the circuit load, which fluctuations are caused by software-related variations of the load.

SUMMARY OF THE INVENTION

It is, therefore, the object of the invention to provide a circuit arrangement for the power supply of an integrated circuit which ensures a reliable and low-emission supply of the integrated circuit with energy.

This object is achieved according to the invention by a circuit arrangement for supplying power to an integrated circuit. The circuit arrangement comprises a circuit carrier, an integrated circuit, a supply unit, and an external buffer condenser, i.e. buffer capacitor, for reducing the load-related voltage fluctuations. The circuit carrier has a circuit carrier ground. The integrated circuit has a circuit load, a supply connection, a first ground connection that is externally connected by a grounding conductor with the circuit carrier ground, and a second ground connection. The supply unit is connected with the supply connection of the integrated circuit, and is embodied so that it has a current source behavior at least at the clock frequency of the integrated circuit. The external buffer capacitor is connected parallel to the circuit load, and is connected to the supply connection and to the second ground connection of the integrated circuit. According to invention an external buffer condenser or buffer capacitor is provided for reducing the load-related voltage fluctuations, which buffer is connected parallel to the circuit load and is connected to a supply connection and to a ground connection of the integrated circuit. Thus, the buffer condenser is connected externally only with the internal circuit ground of the integrated circuit. The buffer condenser is not directly connected with the circuit carrier ground of the circuit carrier. Further, a supply unit is provided, which is formed such that it has a current source behavior at least at the clock frequency of the integrated circuit. The combination of a supply unit of this type with the measure that the buffer condenser is directly connected only with the internal integrated circuit ground and not with the external circuit carrier ground, on the one hand causes a frequency decoupling between the charging and the discharging of the externally connected buffer condenser and of the internal circuit capacity, and on the other hand causes a limitation of the high-frequency discharging currents to the range of the integrated circuit and the buffer condenser. Whereas the discharging of the buffer condenser continues with the high clock frequency of the integrated circuit, the external charging of the buffer condenser is effected via the circuit carrier at a significantly lower frequency. The lower frequency results from the low-pass behavior of the charging circuit. The buffer condenser and the internal circuit capacity together with a high impedance internal resistance of the supply unit, which is caused by the current source behavior, form an RC-element with the low-pass behavior. Alternatively or additionally, the buffer condenser and the internal circuit capacity together with the supply unit can form an LC-, a ferrite bead C-element or a combination of the mentioned elements, so that a low-pass behavior is achieved. The load frequencies arising in connection with the charging of the buffer condenser are at least an order of magnitude smaller than the discharging frequencies arising in connection with the discharge. The high-frequency discharging currents are limited in space and are existent essentially only within the integrated circuit and the externally connected buffer condenser. The low-frequency charging currents in fact run also through the circuit carrier, on which the integrated circuit is mounted, however, due to the low frequency they do not produce significant emission. The emission of electromagnetic energy is thus very small. The high-frequency discharging currents do not produce significant emission due to the limitation in space within the integrated circuit and the buffer condenser, and the low-frequency charging currents due to the low frequency. By the buffer condenser, which has a significantly larger buffer capacity compared with the internal circuit capacity, a reliable and essentially fluctuation-free voltage supply of the circuit load is ensured. The circuit arrangement according to the invention allows the use of conventional integrated circuits, such as for example microcontrollers, which have at least several ground connections which are internally interconnected and advantageously also several supply connections which are internally interconnected.

An embodiment of the supply unit prevents the low-frequency discharging currents from being superimposed by high-frequency charging currents, which arise because of harmonics of the clock frequency.

A circuit arrangement according to another preferred embodiment, in which there is only a single ground connection from the integrated circuit ground to the circuit carrier ground, structurally prevents a high-frequency electric circuit formed in the integrated circuit from being closed or completed via the circuit carrier ground.

Another inventive embodiment of the circuit arrangement with plural immediately adjacent ground connections on the integrated circuit allows for a better thermal connection of the integrated circuit to the circuit carrier ground. For closely adjacent ground connections, that due to the small distance, the inductance formed between the ground connections and thus the voltage drop, caused by a current flowing by this inductance, is small. This enables the parallel connection of directly adjacent ground connections of the internal circuit ground to the circuit carrier ground with an only small deterioration of the current-driven common-mode-emission behavior. This leads to a more reliable and better heat dissipation from the integrated circuit.

If the allowable emission limit value of the current-driven common-mode-emission is exceeded, then the number of the circuit carrier connections can be reduced successively, until an acceptable emission behavior is achieved. When reducing the number of circuit carrier connections, the circuit carrier connections which are farthest away from each other should always be removed first.

A particularly efficient heat dissipation is achieved, if the so-called die of the integrated circuit is connected to the ground connections in a thermally well-conducting manner, as can be achieved with ball-grid-arrays by inserting so-called thermal vias in the die-carrier, which are electrically connected with ground balls, and by embodying the thermal vias for connecting the ground balls to the plane circuit carrier ground by means of vias in PAD-technology.

A circuit arrangement according to another inventive feature provides that a second integrated circuit is connected to the circuit carrier ground exclusively through the first integrated circuit. This allows for connecting a further fast clocking or clocked integrated circuit without considerable deterioration of the current-driven common-mode-emission.

A circuit arrangement according to other aspects of the invention represent alternative possibilities how the other integrated circuit can be simply supplied with energy.

A second external buffer condenser according to a further inventive embodiment leads to a reduction of voltage fluctuations with the supply of the circuit load of the further integrated circuit. The buffer condenser is connected in corresponding manner only with a supply connection and a ground connection of the further integrated circuit. A direct connection to the circuit carrier ground does not exist. Thus, the buffer condenser does not cause a considerable deterioration of the common-mode-emission of the circuit arrangement.

A communication electric circuit according to the invention allows for a communication between the integrated circuits, for example between a microprocessor and an external storage, wherein the communication electric circuit can be formed by connecting the two integrated circuits with an address and data bus. Due to the fact that the communication electric circuit does not have it's own connection to the circuit carrier ground, the communication electric circuit does not cause a considerable increase of the current-driven common-mode-emission.

BRIEF DESCRIPTION OF THE DRAWINGS

Further features, advantages and details of the invention result from the ensuing description of examples of embodiment on the basis the drawing, in which FIG. 2 shows an equivalent circuit diagram of the circuit arrangement according to. FIG. 1, FIG. 3 shows a principle representation of a circuit arrangement according to a second example of embodiment.

DETAILED DESCRIPTION OF EXAMPLE EMBODIMENTS OF THE INVENTION

Figure 1:
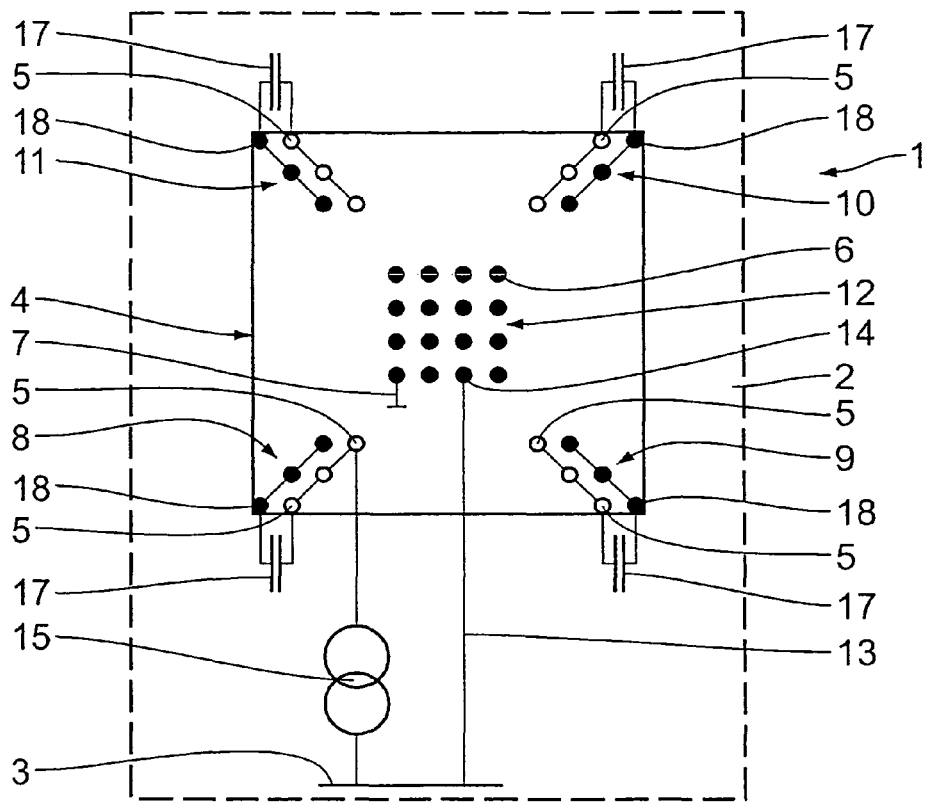
FIG. 1 shows a principle representation of a circuit arrangement according to a first example of embodiment.
Figure 2:
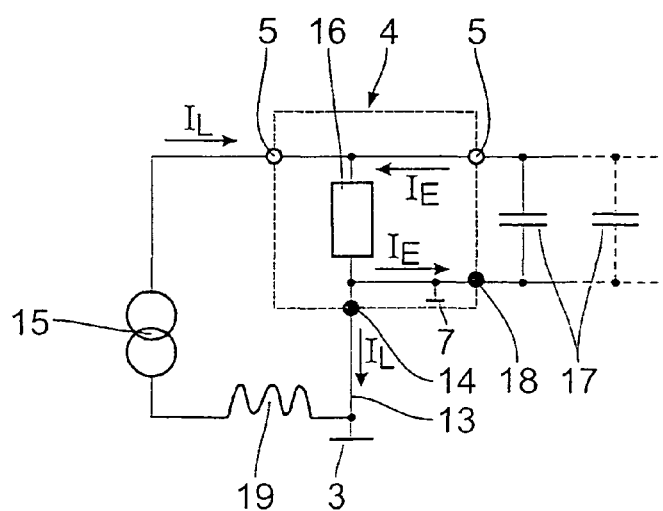

In the following on the basis of FIGS. 1 and 2 a first example of embodiment of the invention described. A circuit arrangement 1 for the power supply of an integrated circuit comprises a circuit carrier 2 with an electric circuit carrier ground 3 and an integrated circuit 4. The circuit carrier 2 is formed for example as a printed circuit board. The integrated circuit 4 is commonly also referred to as IC, IC being the abbreviation for Integrated Circuit. During operation the integrated circuit 4 has a clock frequency f1, the clock frequency being 10 MHz or larger. The integrated circuit 4 can be formed internally clocking or externally clocked. The integrated circuit 4 is arranged on the circuit carrier 2.

At a side facing away from the circuit carrier 2 the integrated circuit 4 comprises several supply connections 5 and several ground connections 6. The supply connections 5 are circuit-internally interconnected and are marked as circles in FIG. 1. The ground connections 6 are correspondingly circuit-internally connected with each other and are connected with a circuit ground 7. The ground connections 6 are marked by dots in FIG. 1. The supply connections 5 and the ground connections 6 are generally referred to as pins.

The supply connections 5 and the ground connections 6 form all in all five groups of connections. A first group of connections 8 is arranged in a corner region of the integrated circuit 4 and comprises three supply connections 5 and ground connections 6 each, which are arranged in pairs and which each form a pair of connections. A corresponding second group of connections 9, a third group of connections 10 and a fourth group of connections 11 are arranged in further corner regions of the integrated circuit 4. A fifth group of connections 12 is arranged centrally at the integrated circuit 4 and comprises only ground connections 6, which are arranged in pairs uniformly spaced in a square. A ground connection 6 of the fifth group of connections is connected directly with the circuit carrier ground 3 via an electro-conductive ground connection 13. This ground connection 6 is explicitly referred to as the first ground connection 14.

For the power supply of the integrated circuit 4 a supply unit 15 is provided. The supply unit 15 is connected with a supply connection 5 of the first group of connections 8 and the circuit carrier ground 3. The supply unit 15 serves for supplying a circuit load 16 with electric power. The circuit load 16 is marked in the equivalent circuit diagram according to FIG. 2 by an impedance, which has an impedance value Z. The supply unit 15 is formed such that it has a current source behavior at least at the clock frequency f1 and advantageously at at least the first three, in particular the first seven, and in particular the first ten harmonics of the clock frequency f1. Current source behavior means that the supply unit 15 has a high internal resistance and supplies a rated supply current that is essentially independent of the circuit load 16. An ideal current source behavior can be achieved in reality only approximately.

For reducing load-related voltage fluctuations buffer capacitors or condensers 17 are provided, which are connected externally to the integrated circuit 4. The buffer condensers 17 are each connected to a supply connection 5 and a ground connection 6 (particularly the second ground connection 18) of the first to fourth group of connections 8, 9, 10, 11. The ground connection directly connected in each case with the buffer condensers 17 is explicitly referred to as the second ground connection 18. The buffer condensers 17 are connected parallel to the circuit load 16 and to an internal circuit capacity, which is not shown in FIGS. 1 and 2. The buffer condensers 17 each comprise a buffer capacity C. The buffer capacities C of the buffer condensers 17 are preferably identical and usually have a capacitance value of 10 nF to 1000 nF each. In case of load-related voltage fluctuations with frequencies, which extend over a decade, for example from 100 kHz to 10 MHz, several buffer condensers can be connected parallel with various buffer capacities. In this case the buffer capacity C calculates from the parallel connection of the buffer condensers 17 with different buffer capacities, which lie for example between 1 µF and 100 nF.

With the first to fourth group of connections 8, 9, 10, 11 the supply connections 5 and in corresponding manner the ground connections 6 are externally interconnected, a ground connection 6 being the second ground connection 18 each. Alternatively or additionally the supply connections 5 and in corresponding manner the ground connections 6 can be internally interconnected. Advantageously, the supply connections 5 and in corresponding manner the ground connections 6 are internally interconnected, if this is not the case, they must be externally interconnected.

The ground connection 13 represents the only connection of the integrated circuit 4 with the circuit carrier ground 3, so that only the first ground connection 14 is directly connected with the circuit carrier ground 3. The further ground connections 6, in particular the second ground connections 18 associated to the buffer condensers 17, are not connected externally with the circuit carrier ground 3. A connection of the further ground connections 6, in particular of the second ground connections 18, to the circuit carrier ground 3 is present only circuit-internally.

If the ground connections 6, 18 are not internally connected, they must be connected externally. Here, the ground connection 13 remains the exclusive connection from the circuit ground 7 to the circuit carrier ground 3.

During operation the circuit carrier ground 3 has an inductive behavior due to its finite expansion. The inductive behavior is shown in the equivalent circuit diagram according to FIG. 2 as circuit carrier inductance 19. The circuit carrier inductance 19 has an inductance value L.

Due to the fact that the supply unit 15 with the clock frequency f1 and with higher frequencies, in particular with multiples of the clock frequency f1, essentially has a current source behavior and that the ground connection 13 is the only connection from the internal circuit ground 7 to the circuit carrier ground 3, a frequency decoupling is effected with the charging and discharging of the externally connected buffer condensers 17 and the internal circuit capacity. Discharging is made with the clock frequency f1 and their harmonics, whereas in turn external charging via the circuit carrier 2 is made with a significantly lower frequency f2. The charging circuit is essentially formed by the supply unit 15, the buffer condensers 17, the internal circuit capacity and the circuit carrier inductance 19. In the charging circuit the supply unit 15 drives a charging current $I_L$, which charges the buffer condensers 17 and the internal circuit capacity and which flows through the circuit carrier inductance 19. Based on the fact that the supply unit 15 has a high internal resistance due to the current source behavior, an RC-element with a low-pass behavior is formed in the charging circuit. Alternatively or additionally in the charging circuit an LC-, ferrite beadC-element or a combination of the elements mentioned can be formed. As a consequence, charging is effect with low frequency with the frequency f2. The low-frequency charging current $I_L$ in fact flows through the circuit carrier inductance 19, however, the emission is very small due to the low frequency f2.

The power supply via the supply unit 15 is regulated with low frequency, this means until approximately 100 kHz, such that the supply voltage of the integrated circuit 4 in this frequency range complies with the tolerance default settings of the manufacturer. Software-related higher-frequency voltage fluctuations are minimized so far by the buffer condensers 17, which are designed accordingly, that also in this frequency range the tolerance default settings of the manufacturer are complied with.

The discharging circuit is formed by the circuit load 16, the buffer condensers 17 and the internal circuit capacity. When discharging a discharging current $I_E$ flows through the circuit load 16. Based on the fact that the supply unit 15 has a current source behavior, and thus a high impedance internal resistance, with the clock frequency f1 and also with higher frequencies, in particular with multiples of the clock frequency f1, ideally no high frequency current flows through the circuit carrier inductance 19, so that at the circuit carrier inductance 19 no high frequency voltage drops. The high frequency discharging current $I_E$ is thus limited in space on the integrated circuit 4 and the buffer condensers 17. Thus, the common-mode-emission is very small during discharge.

In the following on the basis of FIG. 3 a second example of embodiment of the invention is described. The substantial difference compared with the first example of embodiment is that the ground connections 6 of the fifth group of connections 12 are externally interconnected and form several parallel ground connections 13 to the circuit carrier ground 3. Thus, the ground connections 6 are externally connected with the first ground connection 14 and the circuit carrier ground 3. Thus, the directly adjacent ground connections 6 are connected parallel from the internal circuit ground 7 to the circuit carrier ground 3 by means of several vias in PAD technology. This results in a more reliable and better heat dissipation from the integrated circuit 4. The deterioration of the current-driven common-mode-emission behavior is small.

Figure 3:
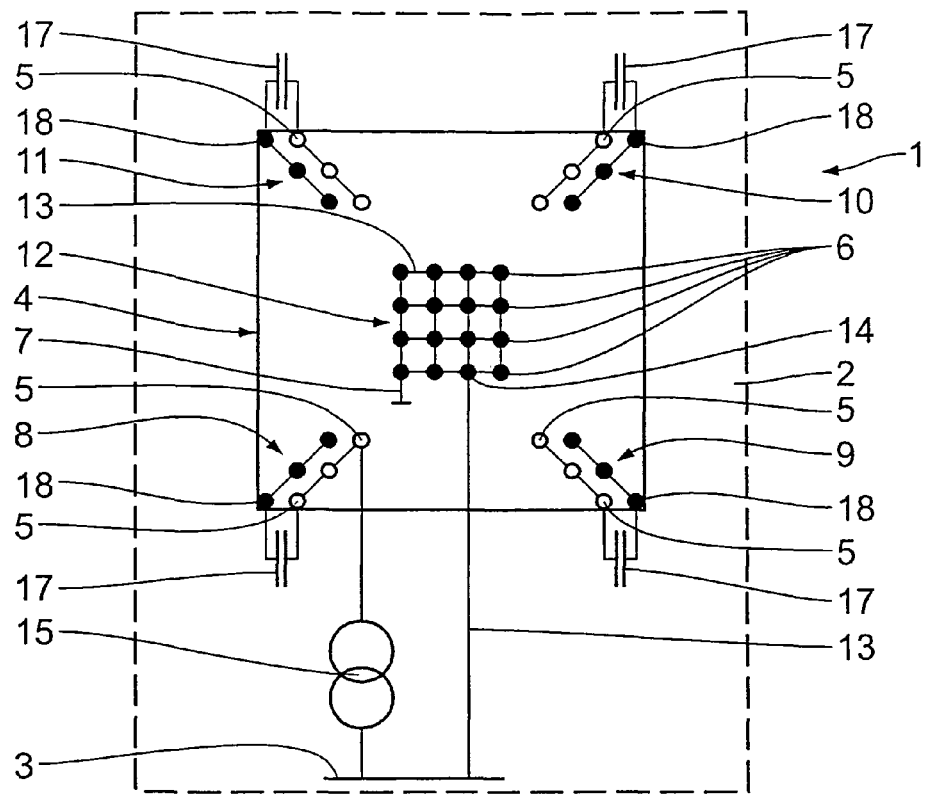

In particular with ball-grid-array-housings with ground connections 6 in an inner square, surrounded by an external square ring, as is shown in FIG. 3, the ground connections 6 in the inner square are suitable for the described interconnecting and parallel connecting to the circuit carrier ground 3.

Figure 4:
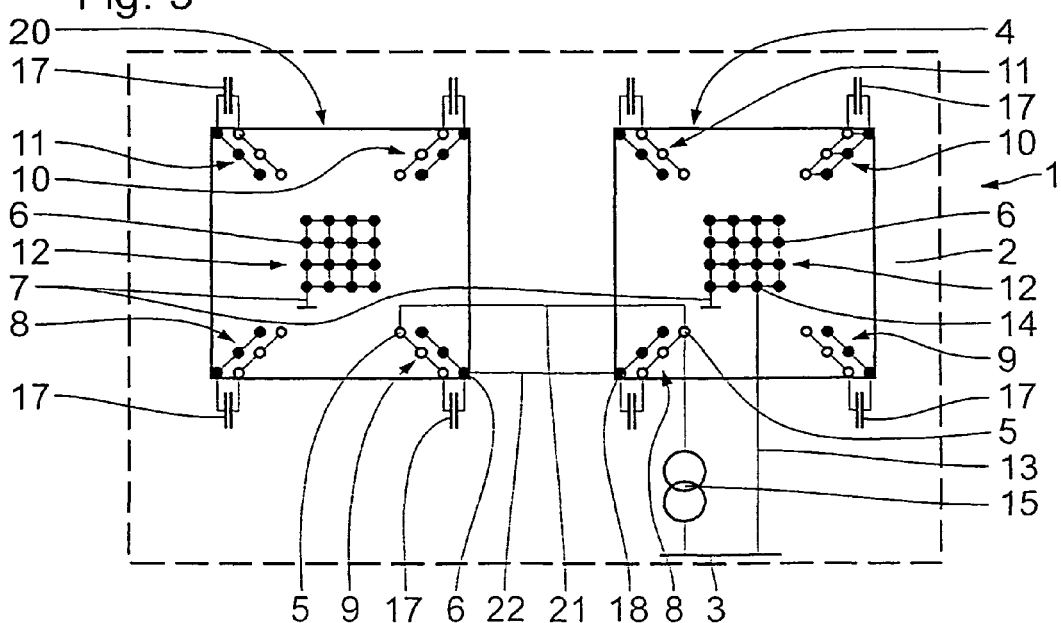
FIG. 4 shows a principle representation of a circuit arrangement according to a third example of embodiment.
Figure 5:
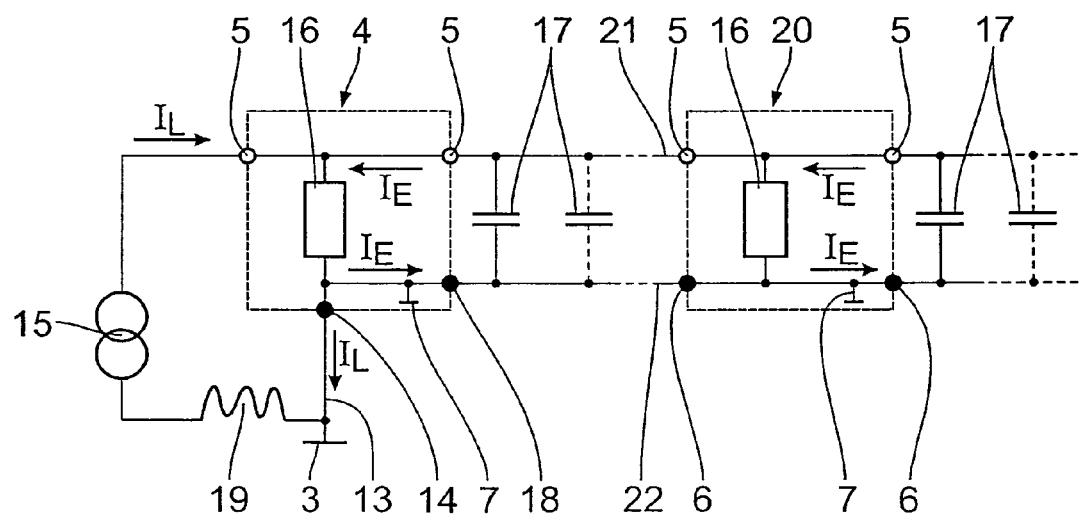
FIG. 5 shows an equivalent circuit diagram of the circuit arrangement according to FIG. 4.

In the following on the basis of FIGS. 4 and 5 a third example of embodiment of the invention is described. The substantial difference compared with the preceding examples of embodiment is that the circuit arrangement 1 comprises a second integrated circuit 20 in addition to the first integrated circuit 4. The second integrated circuit 20 comprises supply connections 5 and ground connections 6 arranged in accordance with the first integrated circuit 4. Furthermore, the second integrated circuit 20 is externally wired in accordance with the first integrated circuit 4 with buffer condensers 17, which have a buffer capacity C. The first integrated circuit 4 is connected in the above described manner with the circuit carrier ground 3 and the supply unit 15. The second integrated circuit 20 is connected exclusively via the first integrated circuit 4 with the circuit carrier ground 3. A supply connection of the second group of connections 9 of the second integrated circuit 20 is connected via a first circuit connection 21 directly with a supply connection 5 of the first group of connections 8 of the first integrated circuit 4. Furthermore, a ground connection 6 of the second group of connections 9 of the second integrated circuit 20 is connected via a second circuit connection 22 directly with the second ground connection 18 of the first group of connections 8 of the first integrated circuit 4. The second integrated circuit 20 is thus connected via the first and second circuit connection 21, 22 to the buffer condenser 17, which is associated to the first group of connections 8 of the first integrated circuit 4. The second integrated circuit 20 is thus supplied with energy via the circuit connections 21, 22. The groups of connections 8, 9, 10, 11 as well as the supply connections and ground connections 6 of the first and second integrated circuit 4, 20, which are to be connected by the circuit connections 21, 22, can in principle be freely chosen, as far as thereby the circuit load 16 and the buffer condensers 17 of the second integrated circuit 20 are arranged parallel to those of the first integrated circuit 4. What is crucial is that there is no direct external connection from the internal circuit ground 7 of the second integrated circuit 20 to the circuit carrier ground 3. This applies appropriately, if further integrated circuits are to be supplied with energy by means of the supply unit 15.

As an alternative, the first circuit connection 21 can be guided from a supply connection 5 of the second integrated circuit 20 directly to the supply unit 15 and can be connected to it. The functionality of the circuit arrangement 1 corresponds to the first example of embodiment.

Figure 6:
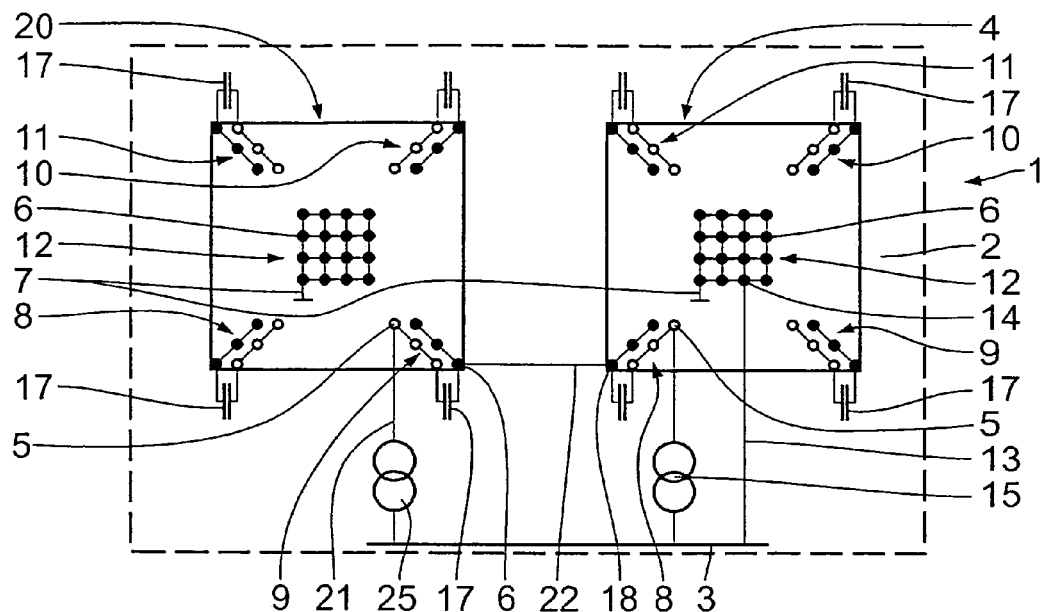
FIG. 6 shows a principle representation of a circuit arrangement according to a fourth example of embodiment.
Figure 7:
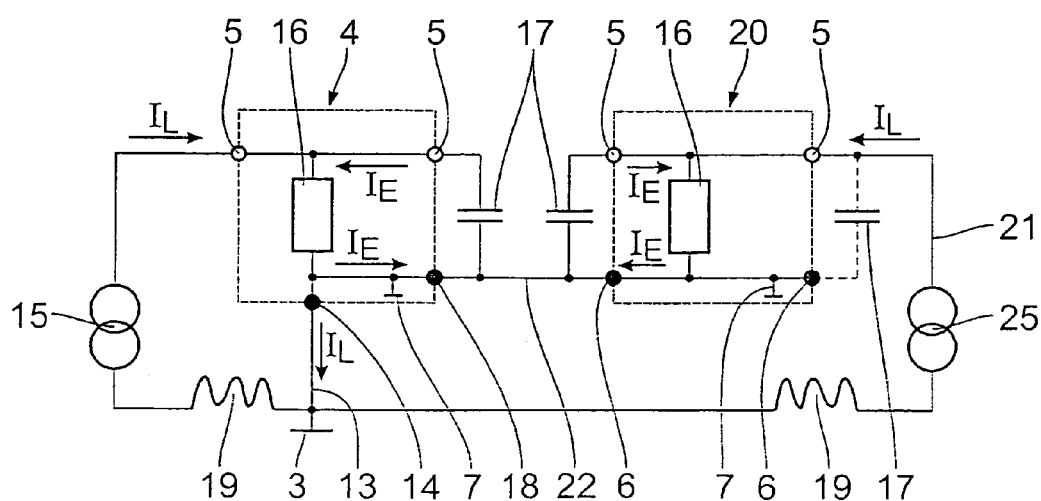
FIG. 7 shows an equivalent circuit diagram of the circuit arrangement according to FIG. 6.

In the following with reference to FIGS. 6 and 7 a fourth example of embodiment of the invention is described. The substantial difference compared with the third example of embodiment is that the circuit arrangement 1 in addition to the first supply unit 15 comprises a correspondingly embodied second supply unit 25 for supplying the second integrated circuit 20 with energy. The first integrated circuit 4 is connected in the above described manner with the circuit carrier ground 3 and the first supply unit 15. The second integrated circuit 20 is exclusively connected via the first integrated circuit 4 with the circuit carrier ground 3. A supply connection 5 of the second group of connections 9 of the second integrated circuit 20 is connected via the first circuit connection 21 directly with the second supply unit 25, which in turn is connected with the circuit carrier ground 3. Furthermore, a ground connection 6 of the second group of connections 9 of the second integrated circuit 20 is connected via the second circuit connection 22 directly with the second ground connection 18 of the first group of connections 8 of the first integrated circuit 4. What is crucial is that there is no direct external connection from the internal circuit ground 7 of the second integrated circuit 20 to the circuit carrier ground 3. Charging of the buffer condensers 17 associated to the first integrated circuit 4 is made in the above described manner by means of the first supply unit 15. In corresponding manner the buffer condensers 17 associated to the second integrated circuit 20 are charged by means of the second supply unit 25. In other respects the functionality of the circuit arrangement 1 corresponds to the preceding examples of embodiment.

In the following, with reference to FIGS. 8 and 9, a fifth example of embodiment of the invention is described. The substantial difference compared with the third embodiment is that the first and the second integrated circuit 4, 20 form a communication electric circuit. The communication electric circuit is embodied for example by means of data or address bus lines. The integrated circuits 4, 20 each comprise a communication connection 23, which are connected by a communication connection 24. The communication electric circuit comprises the second circuit connection 22 as a return. In the communication electric circuit a communication current $I_K$ flows. The communication electric circuit does not have it's own connection to the circuit carrier ground 3. As a consequence, the communication electric circuit does not comprise the circuit carrier inductance 19 and the communication current $I_K$ cannot cause a voltage drop at the circuit carrier inductance 19. This significantly reduces the current-driven common-mode-emission of the communication electric circuit.

Figure 8:
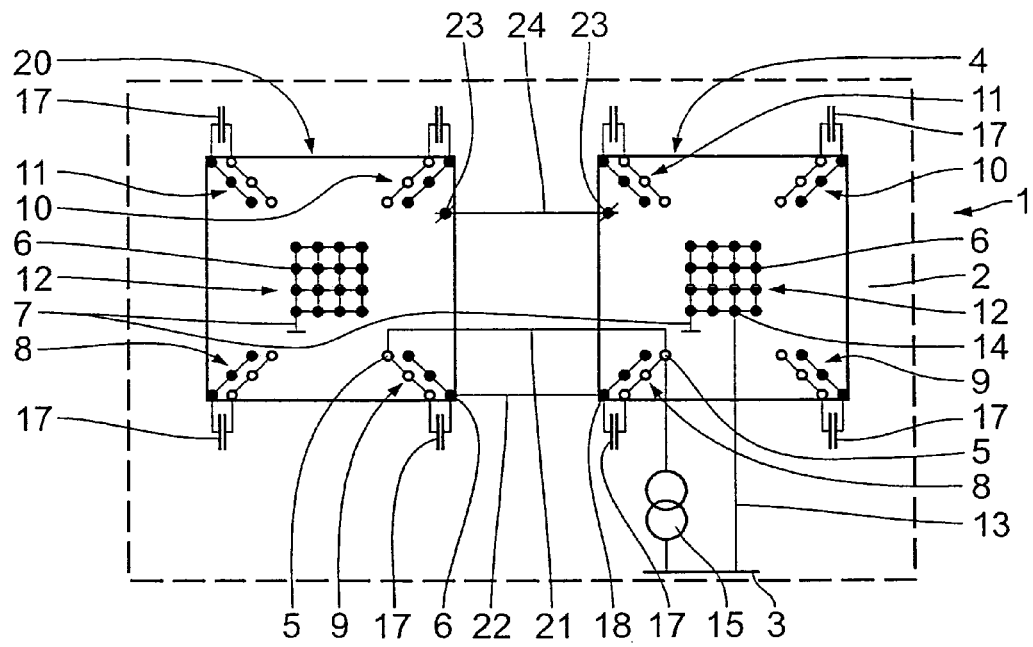
FIG. 8 shows a principle representation of a circuit arrangement according to a fifth example of embodiment.
Figure 9:
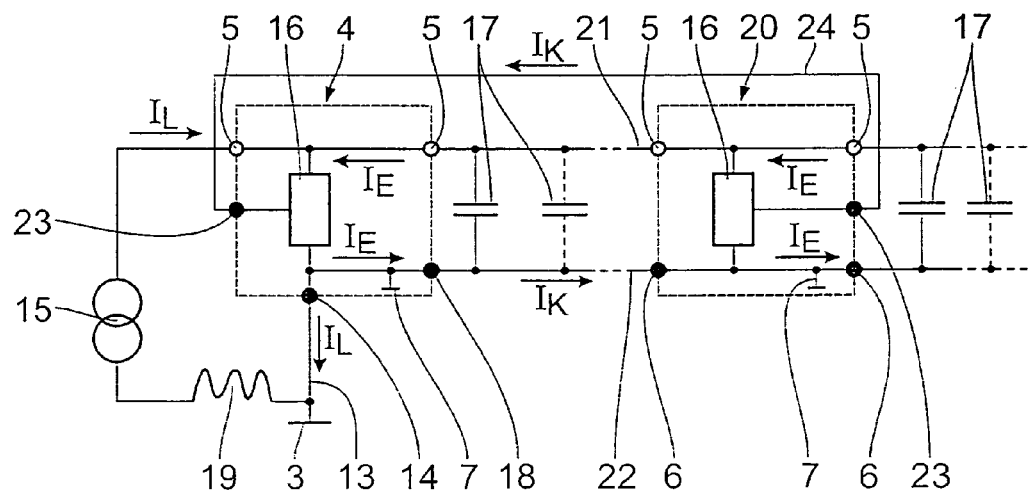
FIG. 9 shows an equivalent circuit diagram of the circuit arrangement according to FIG. 8.

In FIGS. 8 and 9 it was assumed that both the internal functions of the integrated circuits 4, 20 and the communication electric circuit are fed from the same supplying bus of the respective integrated circuit 4, 20. In case of integrated circuits 4, 20 formed as microprocessors, the supply of the core, i.e. the fast-clocking internal functions, and of the communication electric circuit is usually separated. In this case the core must be connected according to FIG. 1 to 7 and the communication electric circuit according to FIGS. 8 and 9.

The circuit arrangements 1 according to invention allow for provision of an integrated circuit 4, 20 with a high clock frequency f1, in particular of more than 10 MHz, with electric power and to realize a fast-clocking external communication without resulting in a considerable emission of electromagnetic energy. By the buffer condensers 17 voltage fluctuations are effectively reduced, without the emission of electromagnetic energy considerably increasing. The EMC-requirements of the automotive industry are thus still complied with also with clock and bus frequencies in the upper MHz range.

Based on the fact that the supply unit 15 has a current source character at least with the clock frequency f1 and preferably also with higher frequencies, this results in a frequency decoupling between the charging and discharging circuit. The high frequency discharging currents are tightly limited within the integrated circuits 4, 20 and the buffer condensers 17. The currents flowing in a discharging process via the circuit carrier 2 are negligibly small by the very high internal resistance of the supply unit 15, so that there is no considerable emission. By the lack of a second connection between the internal circuit ground 7 and the circuit carrier ground 3, which is distanced far enough from the first connection, no high frequency discharging currents can close via the circuit carrier. Thus, there is no high frequency voltage drop at inevitable circuit carrier inductance 19, so that the current-driven common-mode-emission is effectively reduced. As a result of the low frequency the low frequency charging currents do not cause considerable common-mode-emission.

If the integrated circuits 4, 20 form several communication electric circuits, then each communication electric circuit comprises an own communication line and an own return line, the communication lines and correspondingly the return lines running next to each other or one above the other at a constant low distance. Several communication electric circuits are embodied according to FIGS. 8 and 9 by connecting the respective communication line and return line to the associated communication connections and ground connections.

The invention claimed is:

1. A circuit arrangement for supplying electrical power to an integrated circuit, said circuit arrangement comprising:
a circuit carrier;
a circuit carrier ground provided on said circuit carrier;
an integrated circuit adapted to operate at a nominal clock frequency, wherein said integrated circuit is mounted on said circuit carrier, and wherein said integrated circuit includes a circuit load that is to be supplied with electrical power, at least one power supply terminal that is electrically connected to said circuit load, and a plurality of electrically interconnected ground terminals that are electrically connected to said circuit load;
a grounding conductor that electrically connects at least one of said ground terminals of said integrated circuit with said circuit carrier ground on said circuit carrier, wherein said grounding conductor exclusively provides the only electrically conductive connection between said ground terminals of said integrated circuit and said circuit carrier ground on said circuit carrier;
a power supply unit adapted to be operative as a current source at least at said nominal clock frequency of said integrated circuit, wherein said power supply unit is electrically connected between said circuit carrier ground and at least one said power supply terminal of said integrated circuit; and
at least one buffer capacitor that is effective to reduce voltage fluctuations arising from said circuit load, wherein said buffer capacitor is arranged external to said integrated circuit and is electrically connected exclusively to said integrated circuit in that said buffer capacitor is electrically connected exclusively to at least one said power supply terminal and to at least one of said ground terminals of said integrated circuit such that said buffer capacitor is thereby electrically connected parallel to said circuit load of said integrated circuit.

2. The circuit arrangement according to claim 1, wherein said at least one buffer capacitor is not connected directly with said circuit carrier ground, and is grounded exclusively by connection to at least one of said ground terminals of said integrated circuit.

3. The circuit arrangement according to claim 1, wherein said at least one power supply terminal includes plural electrically interconnected power supply terminals, said at least one buffer capacitor includes plural separate buffer capacitors, and said buffer capacitors are connected electrically parallel to each other in that said buffer capacitors are each respectively individually electrically connected to respective individual ones of said power supply terminals and respective individual ones of said ground terminals of said integrated circuit.

4. The circuit arrangement according to claim 1, wherein said grounding conductor is connected to a first one of said ground terminals, and said at least one buffer capacitor is connected to at least one second one of said ground terminals distinct from said first ground terminal on said integrated circuit.

5. The circuit arrangement according to claim 1, wherein said at least one power supply terminal includes plural electrically interconnected power supply terminals, said power supply unit is connected to a first one of said power supply terminals, and said at least one buffer capacitor is respectively connected to a respective second one of said power supply terminals distinct from said first power supply terminal.

6. The circuit arrangement according to claim 1, wherein said plurality of ground terminals of said integrated circuit includes a group of ground terminals that are grouped together immediately adjacent to one another and are electrically interconnected with one another either internally or externally with respect to said integrated circuit, and wherein said grounding conductor is connected to one or more of said ground terminals of said group.

7. The circuit arrangement according to claim 1, wherein said grounding conductor comprises plural electrically conductive vias that are connected electrically parallel to one another and arranged immediately adjacent to one another such that a differential impedance and a differential voltage drop between said vias is negligibly small and said plural vias are thus electrically operative as a single conductive path providing said only electrically conductive connection between said ground terminals of said integrated circuit and said circuit carrier ground on said circuit carrier.

8. The circuit arrangement according to claim 1, wherein said grounding conductor consists of a single conductor that is electrically operative as a single conductive path providing said only electrically conductive connection between said ground terminals of said integrated circuit and said circuit carrier ground on said circuit carrier.

9. The circuit arrangement according to claim 1, wherein said power supply unit is separate and external from said integrated circuit.

10. The circuit arrangement according to claim 1, wherein said grounding conductor exclusively provides the only direct electrically conductive connection between said integrated circuit and any ground point external to said integrated circuit.

11. A circuit arrangement for supplying electrical power to an integrated circuit, said circuit arrangement comprising:
a circuit carrier;
a circuit carrier ground provided on said circuit carrier;
a first integrated circuit adapted to operate at a nominal clock frequency, wherein said first integrated circuit is mounted on said circuit carrier, and wherein said first integrated circuit includes a circuit load that is to be supplied with electrical power, at least one power supply terminal that is electrically connected to said circuit load, and a plurality of electrically interconnected ground terminals that are electrically connected to said circuit load;
a grounding conductor that electrically connects at least one of said ground terminals of said first integrated circuit with said circuit carrier ground on said circuit carrier, wherein said grounding conductor exclusively provides the only electrically conductive connection between said ground terminals of said first integrated circuit and said circuit carrier ground on said circuit carrier;
a power supply unit adapted to be operative as a current source at least at said nominal clock frequency of said first integrated circuit, wherein said power supply unit is electrically connected to at least one said power supply terminal of said first integrated circuit;
at least one buffer capacitor that is effective to reduce voltage fluctuations arising from said circuit load, wherein said buffer capacitor is arranged external to said first integrated circuit and is electrically connected exclusively to said first integrated circuit in that said buffer capacitor is electrically connected exclusively to at least one said power supply terminal and to at least one of said ground terminals of said first integrated circuit such that said buffer capacitor is thereby electrically connected parallel to said circuit load of said first integrated circuit; and a second integrated circuit with a ground terminal that is electrically connected to one of said ground terminals of said first integrated circuit whereby said ground terminal of said second integrated circuit is electrically connected to said circuit carrier ground exclusively via said ground terminals of said first integrated circuit and said grounding conductor that connects at least one of said ground terminals of said first integrated circuit with said circuit carrier ground.

12. The circuit arrangement according to claim 11, wherein said second integrated circuit has a power supply terminal that is electrically connected to at least one said power supply terminal of said first integrated circuit, whereby said second integrated circuit is connected to and operative to be powered by said power supply unit and said at least one buffer capacitor that are connected to said first integrated circuit.

13. The circuit arrangement according to claim 11, wherein said power supply unit is a first power supply unit, said circuit arrangement further comprises a second power supply unit adapted to be operative as a current source at least at a nominal clock frequency of said second integrated circuit, and said second integrated circuit has a power supply terminal that is electrically connected to said second power supply and is not electrically connected to said first power supply.

14. The circuit arrangement according to claim 11, further comprising at least one further buffer capacitor that is effective to reduce voltage fluctuations arising in said second integrated circuit, wherein said further buffer capacitor is arranged external to said second integrated circuit and is electrically connected exclusively to said second integrated circuit in that said further buffer capacitor is electrically connected exclusively to at least one power supply terminal of said second integrated circuit and to said ground terminal of said second integrated circuit.

15. The circuit arrangement according to claim 11, wherein said first and second integrated circuits together form a communication circuit in that each one of said integrated circuits respectively comprises a respective communication terminal, and said circuit arrangement further comprises a communication conductor that electrically connects said respective communication terminals of said first and second integrated circuits with one another.

* * * * *

UNITED STATES PATENT AND TRADEMARK OFFICE
CERTIFICATE OF CORRECTION

PATENT NO. : 8,378,449 B2
APPLICATION NO. : 12/312058
DATED : February 19, 2013
INVENTOR(S) : Goeran Schubert It is certified that error appears in the above-identified patent and that said Letters Patent is hereby corrected as shown below:

In the Specification

Column 3,
Line 20, after "connections,", delete "that";

Column 5,
Line 26, after "connection", insert --6--;

Column 7,
Line 18-19, after "supply connection", insert --5--;
Line 33, after "supply connections", insert --5--.

Signed and Sealed this
Fifth Day of November, 2013

Teresa Stanek Rea
*Deputy Director of the United States Patent and Trademark Office*